United States Patent [19]

Lewis

[11] Patent Number: 5,778,947

[45] Date of Patent: Jul. 14, 1998

[54] BENT LEAD REPAIR TOOL FOR ELECTRONIC COMPONENTS

[75] Inventor: Mark F. Lewis, Colorado Springs, Colo.

[73] Assignee: United Technologies Corporation, Windsor Locks, Conn.

[21] Appl. No.: 854,263

[22] Filed: May 9, 1997

[51] Int. Cl.$^6$ ............................................. B21F 1/02
[52] U.S. Cl. ............................................. 140/147
[58] Field of Search ............................ 140/105, 147

[56] References Cited

U.S. PATENT DOCUMENTS

| | | | |
|---|---|---|---|
| 2,493,560 | 1/1950 | Vasselli | 140/147 |
| 3,568,732 | 3/1971 | Kelly et al. | 140/147 |
| 3,891,013 | 6/1975 | Folk et al. | 140/147 |
| 3,936,933 | 2/1976 | Folk et al. | 29/628 |
| 4,125,137 | 11/1978 | Shatto, Jr. | 140/147 |
| 4,420,020 | 12/1983 | McGeary et al. | 140/147 |
| 4,643,234 | 2/1987 | Alemanni | 140/147 |
| 4,911,210 | 3/1990 | Hillegonds | 140/147 |
| 5,005,611 | 4/1991 | Hecker | 140/147 |

Primary Examiner—Lowell A. Larson

[57] ABSTRACT

An apparatus and method for straightening bent leads for an electrical component having a tiebar attached to the distal end of the component leads includes a repair surface with a repair stage mounted thereon. The repair stage has a series of combs projecting therefrom and defining a series of recesses there between. The recesses conform to the lead pattern of the component. A cutout is located along an edge of the repair stage, terminating a recess. An alignment means is also mounted to the repair surface and located relative to the cutout such that a form punch can be inserted into the aligning means and into the cutout. The bent lead of the component is positioned on the repair stage with the tiebar against the edge of the repair stage having the cutout disposed thereon. As the form punch enters the cutout the bent lead is also forced into the cutout thus pulling the remainder of the lead into the recess terminated by the cutout and straightening the remainder of the lead. The bent portion of the lead is now located proximate the tiebar such that the bent portion of the lead can be removed when the tiebar is removed from the component for installation of the component.

9 Claims, 2 Drawing Sheets

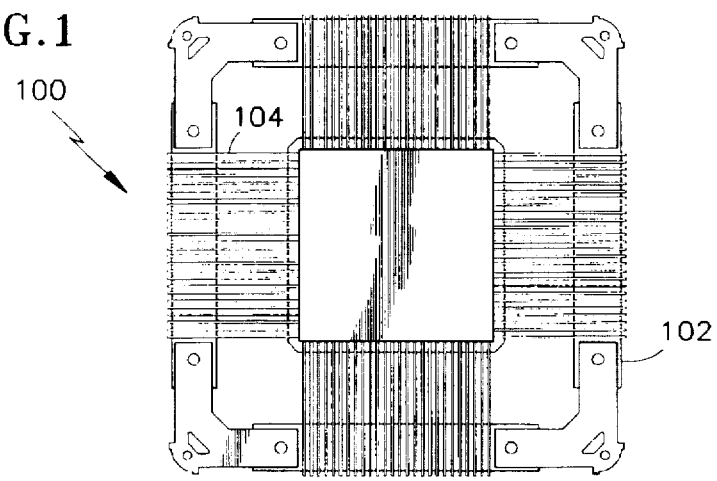
FIG. 1
FIG. 5
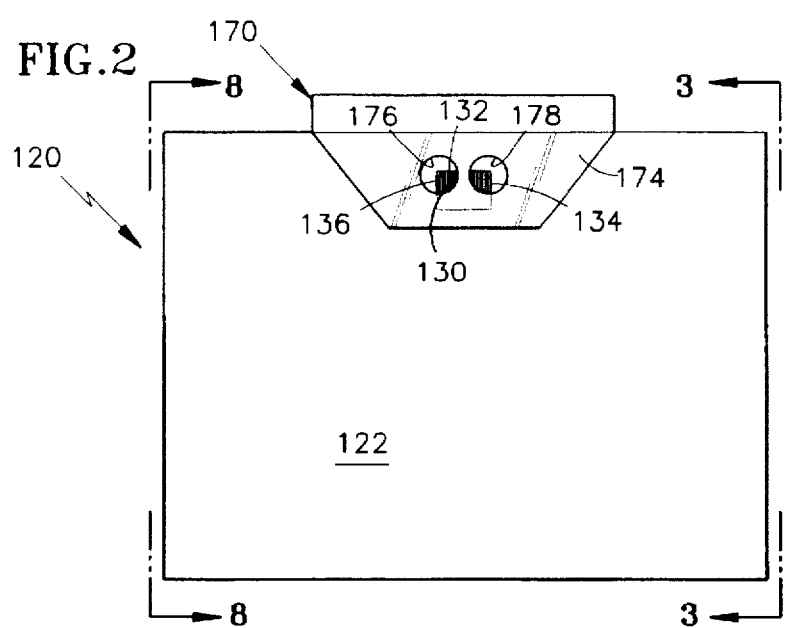
FIG. 2
FIG. 4
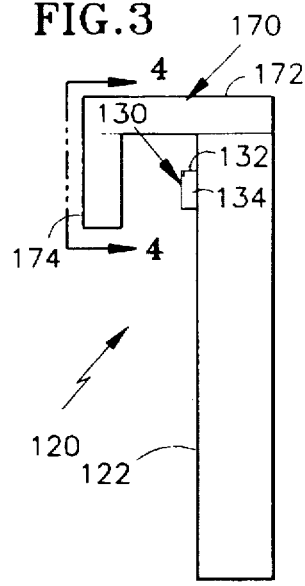
FIG. 3
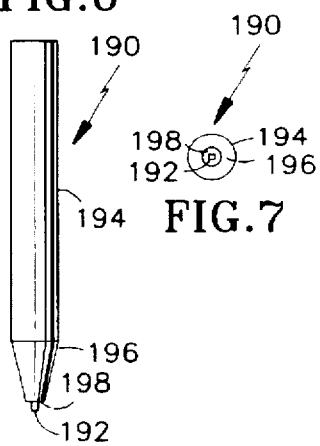
FIG. 6
FIG. 7

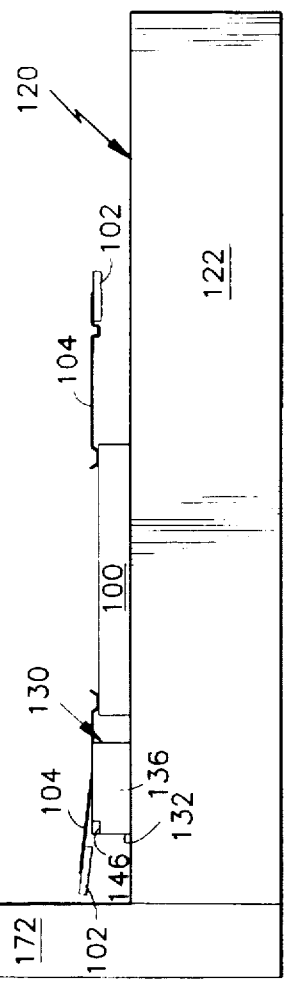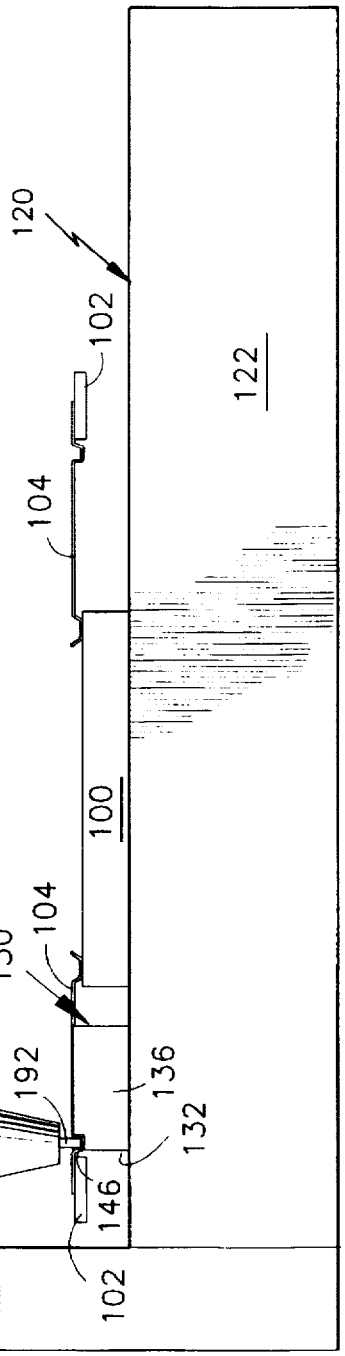

BENT LEAD REPAIR TOOL FOR ELECTRONIC COMPONENTS

TECHNICAL FIELD

This invention relates to a device for straightening leads for electrical components and more particularly to a device for straightening leads for electrical components having tiebars and more particularly for flat pack semiconductor devices having non-conducting strip (NCS) tiebars.

BACKGROUND ART

In order to improve the manufacturing efficiency of electronic circuit boards, manufacturers have moved from soldering of discrete components to a wave soldering process. For the soldering of discrete components, the leads of electrical components were placed through holes in the circuit board and the individual components were then soldered in place.

In a wave soldering process the leads, which are normally planar with the component package, are bent 90° toward the circuit board and then 90° again such that a portion of the lead is parallel to the surface of the board. This lead arrangement is known as a gull wing. The component with the leads thus formed is then placed on a circuit board having preformed solder pads conforming to the desired position of the component leads. Once the components have been placed on the board the assembly is heated to reflow the solder. The solder solidifies after the heat is removed thus soldering the leads to the circuit board.

Over time the process of semiconductor manufacture has improved increasing the density of components located on the semiconductor devices which in turn increases the number of leads coming off these devices and heightens the need to maintain tighter tolerances for the positioning of the leads. The two key parameters for determining the acceptability of the leads are co-planarity, which is a measure of how much the leads deviate from the plane of the electronic package, and true positional criteria which is a measure of the distance between adjacent leads. Components with bent or twisted leads cannot be mounted to the board and are either scrapped or repaired.

In order to maintain tolerance during manufacture tiebars are used which connect the component leads together at the distal end of the lead from the component. Non-conducting strip (NCS) tiebars are also used. NCS tiebars offer an advantage over conducting tiebars in that the component may be tested and shipped with the tiebar in place thus minimizing lead damage during shipping.

The repair of component leads is usually performed by a technician using various probes and a template as described in U.S. Pat. No. 5,542,457.

This patent discloses a precisely flat surface for bending non-conforming leads back into the proper plane (co-planarity). Once the leads are in the proper plane the leads are then placed in a template having recesses precisely corresponding to the desired lead shape. The technician then uses tweezers or probes to bend the non-conforming lead to conform to the recess.

This method of lead repair requires great skill and is time consuming in that the technician must precisely bend each lead into conformance with the template. Furthermore if the lead is bent while the tiebar is attached, the lead is actually stretched and therefore repair by the method disclosed in U.S. Pat. No. 5,542,457 is difficult because the tiebar constrains the distal end of the lead.

Therefore there is a need for a method and device for repairing component leads that reduces cost and repair time. There is also a need for a repair method and device that reduces the amount of skill required to repair component leads. There further exists a need for a repair method and device for the repair of components having tiebars attached to the distal end of component leads.

DISCLOSURE OF THE INVENTION

An object of the present invention is to reduce repair time for bent leads of electrical components.

It is a further object of the invention to simplify the repair of bent leads for electrical components.

Another object of the present invention is to facilitate the repair of bent leads for electrical components having tiebars.

According to the present invention a bent lead repair tool for electrical components is disclosed which consists of a flat base on which is mounted a repair stage and an alignment bracket.

The repair stage has a series of raised combs with recesses disposed therebetween wherein the recesses correspond to the lead pattern of the electronic component whose leads are to be straightened. The repair stage is located relative to the alignment bracket such that the tiebar may be located between the repair stage and the alignment bracket.

Two cutouts are located on the edge of the repair stage nearest the alignment bracket. The cutouts are further arranged such that one is on the left edge of the repair stage and the other is on the right edge, as viewed from the alignment bracket. The cutouts are formed such that they terminate two combs and a recess disposed therebetween on the left and right side of the repair stage.

The alignment bracket consists of a side plate and an alignment plate. The side plate is disposed between the base plate and alignment plate and operates to maintain the relative position of the alignment plate and base plate. The alignment plate has a right and left alignment hole disposed therein. The alignment holes are aligned with the right and left cutouts of the repair stage.

The subject invention further consists of a form punch having a barrel with a radius slightly smaller than the alignment holes. Disposed on an end of the barrel is a tapered section that transitions to an end punch. The end punch is adapted in size and- shape to fit within the cutouts. The tapered end facilitates insertion of the form punch into the alignment hole. The relationship of the barrel radius to that of the alignment hole serves to position the end punch relative to the cutout.

In operation an electronic component having a tiebar is positioned such that the bent lead is located in the recess intersecting the cutout. The tiebar is further positioned in contact with the repair stage and between the repair stage and the alignment bracket. The form punch is then inserted through the alignment bracket such that the end punch forces a portion of the bent lead into the cutout. As the lead is forced into the cutout the remainder of the bent lead straightens and conforms to the recess.

The bent portion of the lead is now located at a distal end of the lead, away from the electronic component and proximate to the tiebar. The lead may now be trimmed as part of the normal removal of the tiebar, prior to mounting on a printed circuit, such that the bent portion of the lead is removed with the tiebar.

The present invention has the utility of simplifying the repair procedure for bent leads on electrical components.

The present invention has the further utility of reducing repair time for bent leads of electrical components. The present invention also has the utility of reducing the skill required to repair bent leads of electrical components.

BRIEF DESCRIPTION OF DRAWINGS

FIG. 1 is a plan view of a ceramic flatpack package with tiebar;

FIG. 2 is a plan view of the bent lead repair tool for electronic components according to the present invention;

FIG. 3 is an elevational view of the bent lead repair tool for electronic components taken along line 3—3 of FIG. 2;

FIG. 4 is a plan view of the repair stage taken along line 4—4 of FIG. 3;

FIG. 5 is a partial elevational view of the repair stage;

FIG. 6 is a plan view of the form punch;

FIG. 7 is a plan view of the punch end;

FIG. 8 is a elevational view of the bent lead positioned in the repair stage prior to repair, taken along line 8—8 of FIG. 2;

FIG. 9 is a elevational view similar to FIG. 8 of the bent lead positioned in the repair stage with the form punch positioned in the cutout.

DETAILED DESCRIPTION OF THE PREFERRED EMBODIMENT

FIG. 1 shows a component 100 having a tiebar 102 preferably a non-conducting strip (NCS) tiebar. The tiebar 102 is used to prevent the leads 104 from being damaged during manufacture. NCS tiebars are used to allow for testing of the component without removing the NCS tiebar providing the further advantage of being able to ship the finished product with the tiebar 102 attached to protect the leads 104 during shipping.

Tool 120 of the present invention as shown in FIG. 2 is used to straighten leads 104 if they are bent. The size of packages and number and size of leads vary and therefore the dimensions provided herein for tool 120 are by way of example, it being understood that these dimensions may vary depending upon component 100. For the purposes of this disclosure it is assumed that the leads are on a pitch of 0.025 inches which is the distance between the centerline of adjacent leads.

Referring to FIGS. 2 and 3, bent lead repair tool 120 for repairing electronic components 100 according to the principles of the present invention is shown. The bent lead repair tool 120 consists of a flat plate 122 which serves as a work surface for the electronic component 100 and serves to maintain the remaining components described herein in proper alignment. Mounted on the flat plate 122 is the repair stage 130 and the forming punch guide 170.

As shown in FIG. 2, the repair stage has a first edge 132 located opposite the forming punch guide 170 and a right edge 134 and a left edge 136. The first edge 132 is located a distance from the forming punch guide 170 such that the tiebar 102 may be inserted between the repair stage 130 and the forming punch guide 170.

Referring to FIG. 4, the overall width of the repair stage 130, as measured along the first edge 132, is less than half the distance between the opposing edges of tiebar 102. This allows the component 100 to be positioned relative to the repair stage 130 so that any lead 104 may be aligned in a recess 150 or 156 which intersects the cutout 146 or 144.

As shown in FIG. 5, located on the surface of the repair stage 130 are a series of combs 138 with recesses 140 disposed there between. The pattern of recesses 140 corresponds to the pattern of leads 104 of the component 100 to be repaired, as shown in FIG. 1. A comb is located on both the right edge 136 and the left edge 134.

The width of combs 138 in the present embodiment is preferably 0.011 inches and the width of a recesses 140 is preferably 0.014 inches. The width of the combs 138 and the recesses 140 are determined by the pitch of the leads of the lead configuration of the component 100 to be repaired, which as indicated above, is preferably 0.025 inches.

The height of the combs 138 and therefore the recesses 140 disposed there between is also determined by the lead configuration of the component to be repaired. In the present embodiment, the height of the combs 138 and recesses 140 is 0.015 inches, which is slightly greater than the height of the leads 104. The tops 142 of the combs 138 are finished with a radius to minimize interference between leads 104 and the combs 138 as the leads 104 are being straightened. Referring again to FIG. 4, a left cutout 146 is located adjacent the intersection of the left edge 136 and the first edge 132 of the repair stage 130. A right cutout 144 is located adjacent the intersection of the right edge 134 and the first edge 132 of the repair stage 130. The left cutout 146 terminates the leftmost comb 148 located along the left edge 136, the recess 150 adjacent the leftmost comb 148 and the next comb 152. The right cutout 144 terminates the rightmost comb 154 located along the right edge 134, the recess 156 adjacent this rightmost comb 154 and the next comb 158.

The dimensions of cutouts 146 and 144 are determined by the maximum anticipated bend in lead 104 to be straightened. For the present configuration for a lead pitch of 0.025 inches, the depth is preferably 0.025 inches and the distance from the first edge 132 is preferably 0.055 inches. The edges 160 and 161 of the cutouts 146 and 144 respectively, opposite the first edge 132, are finished with a radius to minimize interference between the lead 104 an edge of the cutouts 146 and 144. In the present embodiment the radius is 0.005 inches.

The forming punch guide 170 as shown in FIGS. 2 and 3 includes a side plate 172 and a top plate 174. The side plate 172 serves to connect and maintain alignment of the top plate 174 to the flat plate 122.

The top plate 174 is located a distance above the flat plate 122 such that the tiebar 102 of the component 100 to be repaired can be inserted between the repair stage 130 and the forming punch guide 170. The top plate has two alignment holes 176 and 178 located there through. The left alignment hole 176 is positioned above the left cutout 146 and the right alignment hole 178 is positioned above the right cutout 144 such that when the forming punch 190, described herein, is inserted through the alignment holes 176 and 178 the punch end 192, described herein, will be positioned in the cutouts 144 and 146. The top plate 174 may be formed of a clear material, such as quartz, to provide the operator with better visibility of the work piece.

The forming punch 190, as shown in FIGS. 6 and 7, comprises barrel 194, a tapered section 196 and punch end 192. The barrel 194 is adapted to be received by the alignment holes 176 and 178 such that the punch end 192 will be properly aligned with the cutouts 144 and 146 when the forming punch 190 is inserted in the alignment holes 176 and 178.

The punch end 192 as shown in FIG. 7 is located on the smaller diameter end 198 of the tapered section 196 which connects the barrel 194 to the smaller diameter end 198. The tapered end aids in inserting the forming punch 190 into the alignment holes 176 and 178.

The punch end 192 is adapted in size and shape to be received by the cutouts 144, 146 for forcing the bent lead 104 into cutouts 144 or 146.

FIG. 8 shows a component 100 to be repaired, positioned in the bent lead repair tool 120, with the tiebar 102 positioned between the repair stage 130 and forming punch guide bracket 170 and against the repair stage 130.

FIG. 9 shows the component 100 being repaired with the forming punch 190 inserted through alignment hole 176 and into the cutout 146. As the punch end 192 is forced into the cutout 146 the excess material from the bent lead 104 is forced into the cutout 146. As the excess lead material enters the cutout 146, the remainder of the lead is pulled into the recess 152 thus straightening the lead. After the forming punch 190 and the component 100 are removed from the bent lead repair tool 100 the leads 104 may be trimmed to remove the tiebar 102 along with the portion of the lead 104 that is bent.

Applicant envisions a second embodiment, similar to as shown in FIGS. 1–9 including the base, the repair stage, and form punch, but excluding the alignment bracket.

It should be understood by those skilled in the art that obvious structural modifications can be made without departing from the spirit of the invention. Accordingly, reference should be made primarily to the accompanying claims, rather than the foregoing specification, to determine the scope of the invention.

I claim:

1. An apparatus for repairing a bent lead of a component having a plurality of leads between a body and a tiebar of the component, comprising:

a repair stage means for positioning the bent lead for repair including an upper surface said repair stage comprising a plurality of combs projecting from said upper surface, wherein said plurality of combs define a recess there between for positioning the bent lead for repair;

a receiving means for receiving a portion of the bent lead; and a forcing means for forcing said portion of the bent lead into said receiving means, wherein as the bent lead is forced into said receiving means a remaining portion of the bent lead is pulled into said recess.

2. The apparatus for repairing the bent lead of claim 1 wherein said receiving means is located in said repair stage and wherein said receiving means intersects said recess.

3. The apparatus for repairing the bent lead of claim 2 wherein said receiving means has a lower surface and wherein said lower surface is at a depth below said upper surface.

4. The apparatus for repairing the bent lead of claim 3 further comprising said repair stage having an edge, wherein said receiving means is located along said edge and wherein the tiebar can be positioned along said edge such that as the bent lead is forced into said receiving means a bent portion of the bent lead will be repositioned near the tiebar for subsequent removal along with the tiebar.

5. An apparatus for repairing a bent lead of a component having a plurality of leads between a body and a tiebar of the component, comprising:

a repair stage means for positioning the bent lead for repair including an upper surface said repair stage comprising a plurality of combs projecting from said upper surface, wherein said plurality of combs define a recess there between for positioning the bent lead for repair;

a receiving means for receiving a portion of the bent lead;

a forcing means for forcing said portion of the bent lead into said receiving means, wherein as the bent lead is forced into said receiving means a remaining portion of the bent lead is pulled into said recess; and an alignment means for positioning said forcing means relative to said receiving means.

6. The apparatus for repairing the bent lead of claim 5 wherein said receiving means is located in said repair stage and wherein said receiving means intersects said recess.

7. The apparatus for repairing the bent lead of claim 6 wherein said receiving means has a lower surface and wherein said lower surface is at a depth below said upper surface.

8. The apparatus for repairing the bent lead of claim 7 further comprising said repair stage having an edge, wherein said receiving means is located along said edge and wherein the tiebar can be positioned along said edge such that as the bent lead is forced into said receiving means a bent portion of the bent lead will be repositioned near the tiebar for subsequent removal along with the tiebar.

9. A method of repairing a bent lead of a component having a plurality of leads between a body and a tiebar of the component, comprising:

positioning the component on means for positioning said bent lead for repair wherein said means for positioning comprises a recess;

locating the bent lead on said positioning means such that the bent lead is positioned over a means for receiving a portion of the bent lead; and forcing the bent lead into said means for receiving such that a portion of the bent lead is forced into said means for receiving and a remaining portion of the bent lead is forced into said recess thus straightening said remaining portion of the bent lead.

* * * * *